United States Patent
Hiraki et al.

(10) Patent No.: US 7,858,271 B2
(45) Date of Patent: Dec. 28, 2010

(54) METHOD OF MEASURING DIMENSION OF PATTERN AND METHOD OF FORMING PATTERN

(75) Inventors: Tetsuya Hiraki, Tokyo (JP); Naoki Ohta, Tokyo (JP); Yoshiaki Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 352 days.

(21) Appl. No.: 12/191,735

(22) Filed: Aug. 14, 2008

(65) Prior Publication Data

US 2010/0040957 A1 Feb. 18, 2010

(51) Int. Cl.
- G03F 1/00 (2006.01)
- G03F 1/14 (2006.01)
- G03F 7/20 (2006.01)
- G01N 23/04 (2006.01)

(52) U.S. Cl. ............... 430/5; 430/30; 430/311; 250/311

(58) Field of Classification Search ............ 430/5, 430/30, 311
See application file for complete search history.

(56) References Cited

U.S. PATENT DOCUMENTS

| 5,698,347 | A | 12/1997 | Bae | |
|---|---|---|---|---|
| 6,486,565 | B2 | 11/2002 | Miyako | |
| 2001/0040301 | A1* | 11/2001 | Miyako | 257/797 |
| 2007/0292771 | A1* | 12/2007 | Ke et al. | 430/5 |
| 2007/0292774 | A1* | 12/2007 | Ke et al. | 430/5 |

FOREIGN PATENT DOCUMENTS

| JP | A-04-307958 | 10/1992 |
|---|---|---|
| JP | A-06-275492 | 9/1994 |
| JP | A-11-297588 | 10/1999 |
| JP | A-2006-039488 | 2/2006 |

* cited by examiner

Primary Examiner—Mark F Huff
Assistant Examiner—John Ruggles
(74) Attorney, Agent, or Firm—Oliff & Berridge, PLC

(57) ABSTRACT

A method of measuring dimension of a first pattern with a narrow first width, and a second pattern with a second width wider than the first width of the first pattern and formed in a symmetrical appearance with respect to a center of the second pattern, the second pattern having edges opposed to each other defining the second width, includes a step of forming a pair of first dummy patterns each having a narrow width, the pair of first dummy patterns being spaced from the edges of the second pattern respectively by a distance approximate to the first width of the first pattern, a first measurement step of measuring, using a dimension measuring device, a spaced distance of one of the first dummy patterns from the edge of the second pattern and a width of the one of the first dummy patterns within the same field of view of the dimension measuring device, a second measurement step of measuring, using the dimension measuring device, a width of the first pattern under the same measurement condition as that of the first measurement step, and a calculation step of calculating a width of the second pattern from $W_B = 2D_A + W_D + D_C$, where $W_B$ is the calculated width of the second pattern, $D_C$ is a design value of a distance between the centers of the pair of first dummy patterns, $D_A$ is a measured spaced distance of the one of the first dummy patterns from the edge of the second pattern, and $W_D$ is a measured width of the one of the first dummy patterns.

18 Claims, 9 Drawing Sheets

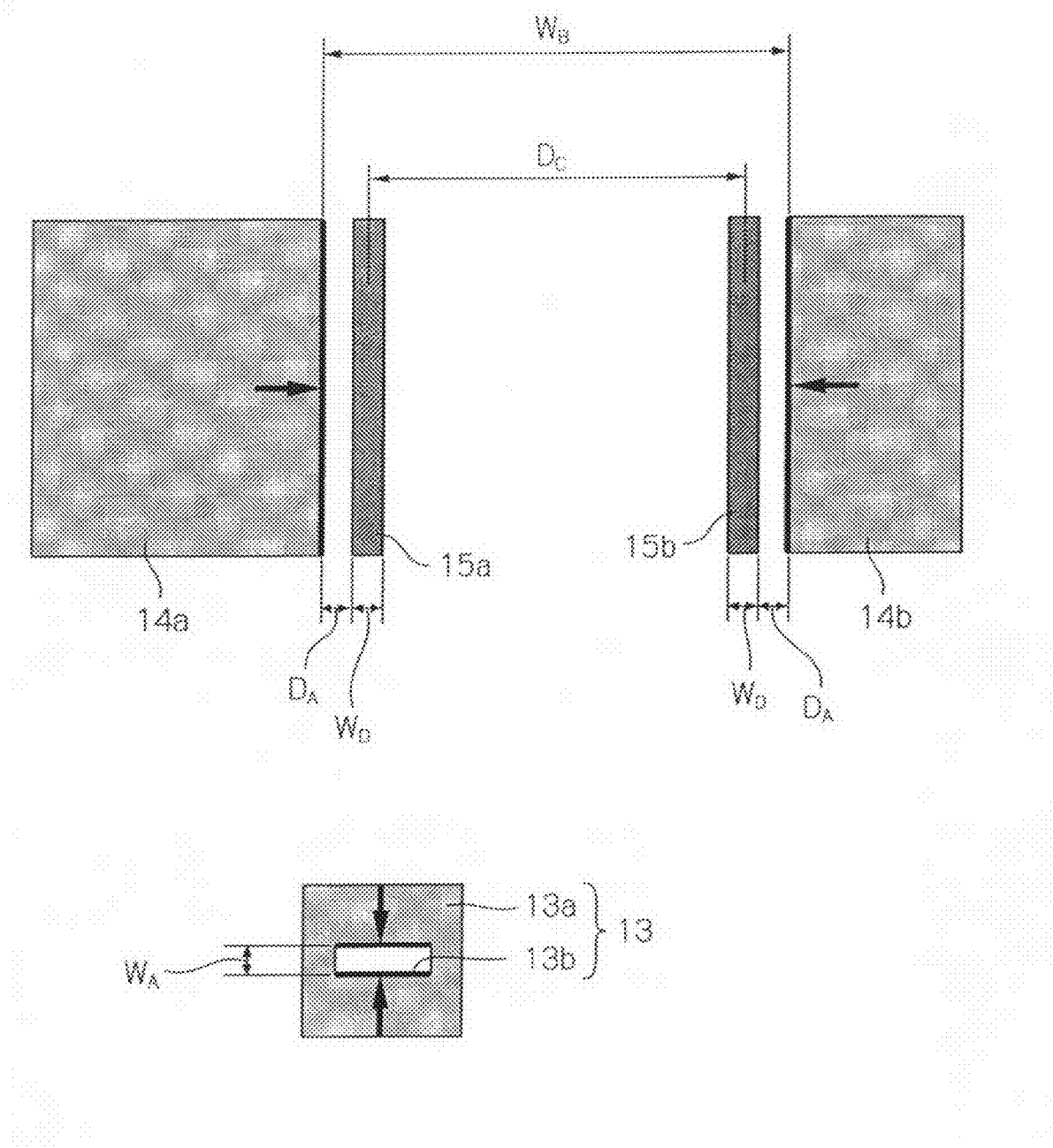

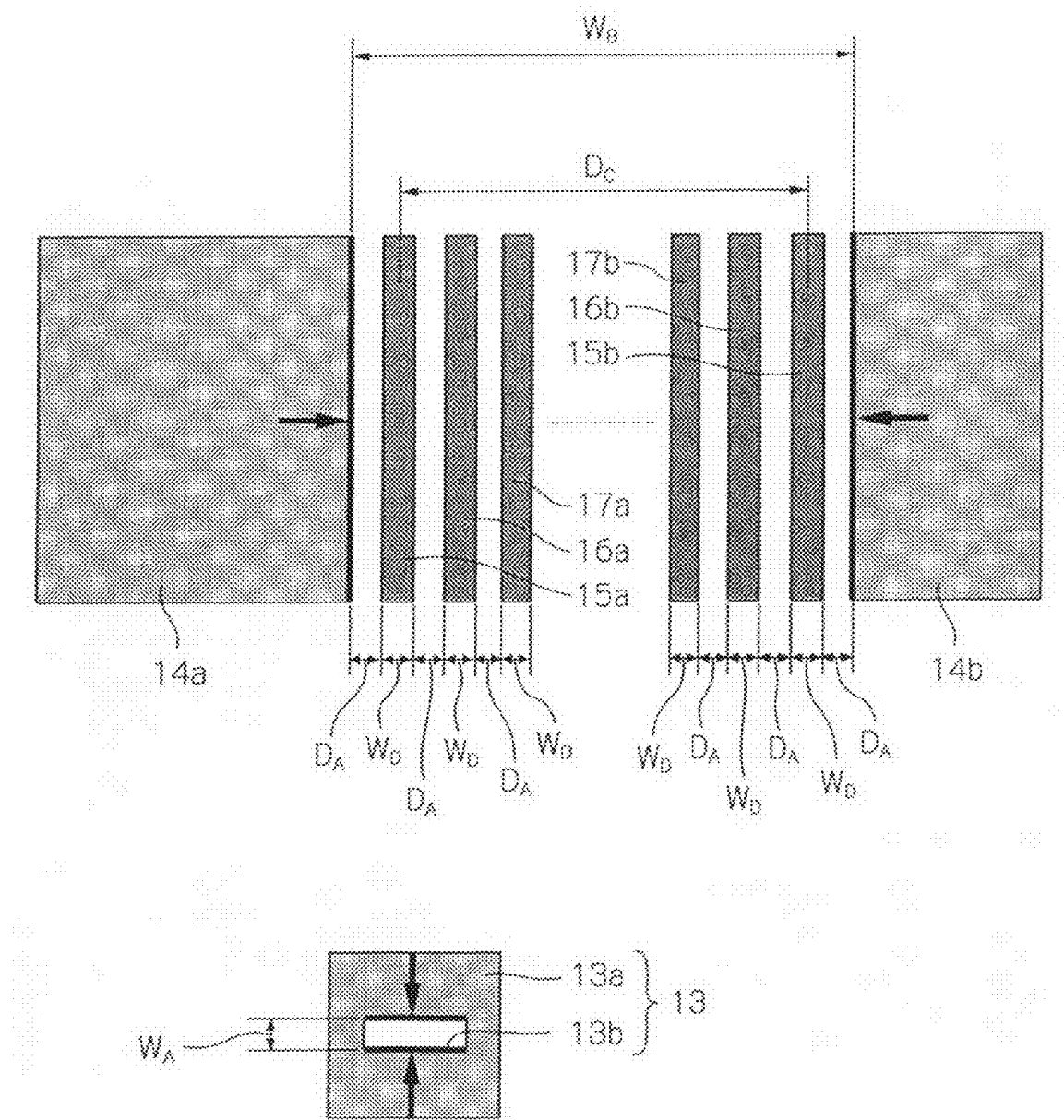

METHOD OF MEASURING DIMENSION OF PATTERN AND METHOD OF FORMING PATTERN

BACKGROUND OF THE INVENTION

1. Field of the Invention

The present invention relates to a method of measuring dimension of a photo-mask pattern or a pattern on a wafer using a scanning electron microscope (SEM), and to a method of forming a photo-mask pattern or a pattern on a wafer.

2. Description of the Related Art

Recently, higher density integration advances in a semiconductor manufacturing process or in a thin-film manufacturing process for fabricating a thin-film element such as a thin-film magnetic head, and therefore a size of a photo-mask pattern or a wafer pattern formed on a wafer by the photo-mask becomes more narrower.

In the thin-film manufacturing process for fabricating the thin-film magnetic head, particularly, different size patterns with both a narrow size and a non-narrow or wide size are sometimes formed on a single photo-mask, and size differences between these patterns tend to increase. For example, poles of a magnetic write head element of the thin-film magnetic head have a pattern with a very small size and lapping sensors of the magnetic write head element such as write Resistance Lapping Guide (RLG) sensors have a pattern with a relatively larger size than that of the poles, and these patterns are formed on the single photo-mask.

According to the conventional measurement method, dimensions of these patterns with large differences in size could not be measured with the same accuracy. This is because, although such pattern dimensions will be in general measured by using a Critical Dimension (CD)-SEM, this CD-SEM can insure the measurement of pattern dimensions at the same accuracy only for patterns fallen within the same field of view at the same magnification of the SEM. For example, since the CD-SEM cannot measure a pattern with a dimension of 10 μm and a pattern with a dimension of 1 nm within the same field of view at the same magnification, it is impossible to obtain measured dimensions with the same accuracy. That is, when the size differences are too large, not only pattern dimensions cannot be accurately measured but also the measured accuracy cannot be checked. As a result, it is impossible to know whether the patterns are displaced or not.

Japanese patent publication No. 11-297588A discloses a method of measuring a displacement of a resist mask pattern formed on a wafer, not of a photo-mask. In the method, an optical measurement device measures a dimension of a large size pattern whereas a SEM measures a dimension of a small size pattern. However, according to this proposed method in which the large size pattern and the small size pattern are measured by different kinds of measurement device respectively, it is impossible to conform accuracies of both measured results to each other. Even in case that the large size pattern and the small size pattern are measured by the same measurement device, if the magnification differs in each measurement, measurement accuracies will never conform to each other.

Conventionally as aforementioned, since it was quite difficult to simultaneously and accurately measure dimensions of patterns with large differences, a designed dimension modified by a predicted error that was experimentally derived was used, in other words a pattern dimension was offset by an estimated value, instead of actual measurement of pattern dimension.

SUMMARY OF THE INVENTION

It is therefore an object of the present invention to provide a method of measuring dimension of a pattern and a method of forming a pattern, whereby a dimension of a large size pattern and a dimension of a small size pattern can be measured with the same accuracy.

Another object of the present invention is to provide a method of measuring dimension of a pattern and a method of forming a pattern, whereby a dimension of a large size pattern and a dimension of a small size pattern can be easily and accurately measured.

According to the present invention, a method of measuring dimension of a first pattern with a narrow first width, and a second pattern with a second width wider than the first width of the first pattern and formed in a symmetrical appearance with respect to the pattern center, the second pattern having edges opposed to each other defining the second width, includes a step of forming a pair of first dummy patterns each having a narrow width, the pair of first dummy patterns being spaced from the edges of the second pattern respectively by a distance approximate to the first width of the first pattern, a first measurement step of measuring, using a dimension measuring device, a spaced distance of one of the first dummy patterns from the edge of the second pattern and a width of the one of the first dummy patterns within the same field of view of the dimension measuring device, a second measurement step of measuring, using the dimension measuring device, a width of the first pattern under the same measurement condition as that of the first measurement step, and a calculation step of calculating a width of the second pattern from $W_B = 2D_A + W_D + D_C$, where $W_B$ is the calculated width of the second pattern, $D_C$ is a design value of a distance between the centers of the pair of first dummy patterns, $D_A$ is a measured spaced distance of the one of the first dummy patterns, and $W_D$ is a measured width of the one of the first dummy patterns.

The first dummy patterns spaced respectively from the edges of the second pattern (large size pattern) by a distance approximate to the first width of the first pattern (small size pattern) and each provided with a narrow width are formed, and the spaced distance and the width of the first dummy pattern are measured by a dimension measuring device such as a SEM within the same field of view. Then, a width of the second pattern is calculated from $W_B = 2D_A + W_D + D_C$, where $D_C$ is a design value of the distance between the centers of the pair of the first dummy patterns, $D_A$ is a measured spaced distance of the pair of the first dummy patterns from the edge of the second pattern, and $W_D$ is a measured width of the first dummy patterns. A width of the first pattern can be measure by the same dimension-measuring device within the same measuring condition (the same magnification) because the width of the first pattern is the similar size as that of the spaced distance and the width of the first dummy pattern.

Since the distance $D_A$ and the width $W_D$ are measured within the same field of view of the dimension measuring device and also the width of the first pattern is measured in the same measuring condition as the distance $D_A$ and the width $W_D$, these widths and distance can be easily and accurately measured with the same degree of accuracy. Further, the second pattern is formed in a cyclic pattern with a symmetrical appearance with respect to the pattern center. Therefore, the pair of first dummy patterns formed inside of the second pattern will produce a symmetrical appearance with respect to the pattern center. Thus, the distance between the centers of a pair of the first dummy patterns is always kept at constant value that is equal to the design value $D_C$, although the centers of the first dummy patterns themselves may be moved. As a result, the width $W_B$ of the second pattern calculated from $W_B=2D_A+W_D+D_C$ can be obtained with the same accuracy as that of the measured width $W_A$ of the first pattern, and these measured width $W_B$ and $W_A$ can be easily and accurately obtained.

It is preferred that the method further includes a step of forming a pair of second dummy patterns each having a narrow width, the pair of second dummy patterns being spaced from edges opposed to each other of the respective first dummy patterns by the spaced distance, respectively.

Since the second dummy patterns are formed at the opposite sides of the first dummy patterns with respect to the second patterns, respectively, boundary conditions at both edges of each of the first dummy patterns can be maintained equal to each other and therefore development conditions such as distribution of developer at the both edges can be equalized to each other. As a result, both edges of each of the first dummy patterns can be determined so that the center position of each of the first dummy patterns does not displace due to the development for example.

It is also preferred that the dimension measuring device is a SEM. In this case, preferably, the first measurement step comprises measuring a spaced distance of one of the first dummy patterns from the edge of the second pattern and a width of the one of the first dummy patterns within the same field of view of the SEM, the field of view being determined so that the SEM can accurately measure.

It is further preferred that the distance between the pair of first dummy patterns and the respective edges of the second pattern is equal to the first width of the first pattern. Since the spaced distance and the width of the first dummy patterns are set to equal to the width of the first pattern, measurement accuracies of the widths of the first and second patterns can be more precisely coincided.

It is further preferred that the method further includes a step of removing the pair of first dummy patterns after the first and second measurement steps.

It is further preferred that the method further includes a step of removing the pair of first dummy patterns and the pair of second dummy patterns after the first and second measurement steps.

It is still further preferred that the first pattern and the second pattern are mask pattern formed on a photo-mask or resist pattern formed on a wafer.

According to the present invention, also, a method of forming a pattern includes a process of measuring dimension of a first pattern with a narrow first width, and a second pattern with a second width wider than the first width of the first pattern and formed in a symmetrical appearance with respect to the pattern center, the second pattern having edges opposed to each other defining the second width, and process of correcting defect of the pattern depending upon the measured dimension. The process of measuring dimension includes a step of forming a pair of first dummy patterns each having a narrow width, the pair of first dummy patterns being spaced from the edges of the second pattern respectively by a distance approximate to the first width of the first pattern, a first measurement step of measuring, using a dimension measuring device, a spaced distance of one of the first dummy patterns from the edge of the second pattern and a width of the one of the first dummy patterns within the same field of view of the dimension measuring device, a second measurement step of measuring, using the dimension measuring device, a width of the first pattern under the same measurement condition as that of the first measurement step, and a calculation step of calculating a width of the second pattern from $W_B=2D_A+W_D+D_C$, where $W_B$ is the calculated width of the second pattern, $D_C$ is a design value of a distance between the centers of the pair of first dummy patterns, $D_A$ is a measured spaced distance of the one of the first dummy patterns, and $W_D$ is a measured width of the one of the first dummy patterns.

The first dummy patterns spaced respectively from the edges of the second pattern (large size pattern) by a distance approximate to the first width of the first pattern (small size pattern) and each provided with a narrow width are formed, and the spaced distance and the width of the first dummy pattern are measured by a dimension measuring device such as a SEM within the same field of view. Then, a width of the second pattern is calculated from $W_B=2D_A+W_D+D_C$, where $D_C$ is a design value of the distance between the centers of the pair of the first dummy patterns, $D_A$ is a measured spaced distance of the pair of the first dummy patterns from the edge of the second pattern, and $W_D$ is a measured width of the first dummy patterns. A width of the first pattern can be measure by the same dimension-measuring device within the same measuring condition (the same magnification) because the width of the first pattern is the similar size as that of the spaced distance and the width of the first dummy pattern.

Since the distance $D_A$ and the width $W_D$ are measured within the same field of view of the dimension measuring device and also the width of the first pattern is measured in the same measuring condition as the distance $D_A$ and the width $W_D$, these widths and distance can be easily and accurately measured with the same degree of accuracy. Further, the second pattern is formed in a cyclic pattern with a symmetrical appearance with respect to the pattern center. Therefore, the pair of first dummy patterns formed inside of the second pattern will produce a symmetrical appearance with respect to the pattern center. Thus, the distance between the centers of a pair of the first dummy patterns is always kept at constant value that is equal to the design value $D_C$, although the centers of the first dummy patterns themselves may be moved. As a result, the width $W_B$ of the second pattern calculated from $W_B=2D_A+W_D+D_C$ can be obtained with the same accuracy as that of the measured width $W_A$ of the first pattern, and these measured width $W_B$ and $W_A$ can be easily and accurately obtained.

It is preferred that the process of measuring dimension further includes a step of forming a pair of second dummy patterns each having a narrow width, the pair of second dummy patterns being spaced from edges opposed to each other of the respective first dummy patterns by the spaced distance, respectively.

Since the second dummy patterns are formed at the opposite sides of the first dummy patterns with respect to the second patterns, respectively, boundary conditions at both edges of each of the first dummy patterns can be maintained equal to each other and therefore development conditions such as distribution of developer at the both edges can be equalized to each other. As a result, both edges of each of the first dummy patterns can be determined so that the center position of each of the first dummy patterns does not displace due to the development for example.

It is also preferred that the dimension measuring device is a SEM. In this case, preferably, the first measurement step comprises measuring a spaced distance of one of the first dummy patterns from the edge of the second pattern and a width of the one of the first dummy patterns within the same field of view of the SEM, the field of view being determined so that the SEM can accurately measure.

It is further preferred that the distance between the pair of first dummy patterns and the respective edges of the second pattern is equal to the first width of the first pattern. Since the spaced distance and the width of the first dummy patterns are set to equal to the width of the first pattern, measurement accuracies of the widths of the first and second patterns can be more precisely coincided.

It is further preferred that the process of measuring dimension further includes a step of removing the pair of first dummy patterns after the first and second measurement steps.

It is further preferred that the process of measuring dimension further includes a step of removing the pair of first dummy patterns and the pair of second dummy patterns after the first and second measurement steps.

It is still further preferred that the first pattern and the second pattern are mask pattern formed on a photo-mask or resist pattern formed on a wafer.

Further objects and advantages of the present invention will be apparent from the following description of the preferred embodiments of the invention as illustrated in the accompanying drawings.

BRIEF DESCRIPTION OF THE DRAWINGS

FIG. 7 shows a pattern diagram illustrating layout of a first pattern (small size pattern) and a second pattern (large size pattern) in a further embodiment according to the present invention;

FIG. 8 shows a pattern diagram illustrating layout of a first pattern (small size pattern) and a second pattern (large size pattern) in a still further embodiment according to the present invention.

DESCRIPTION OF THE PREFERRED EMBODIMENTS

Figure 1:
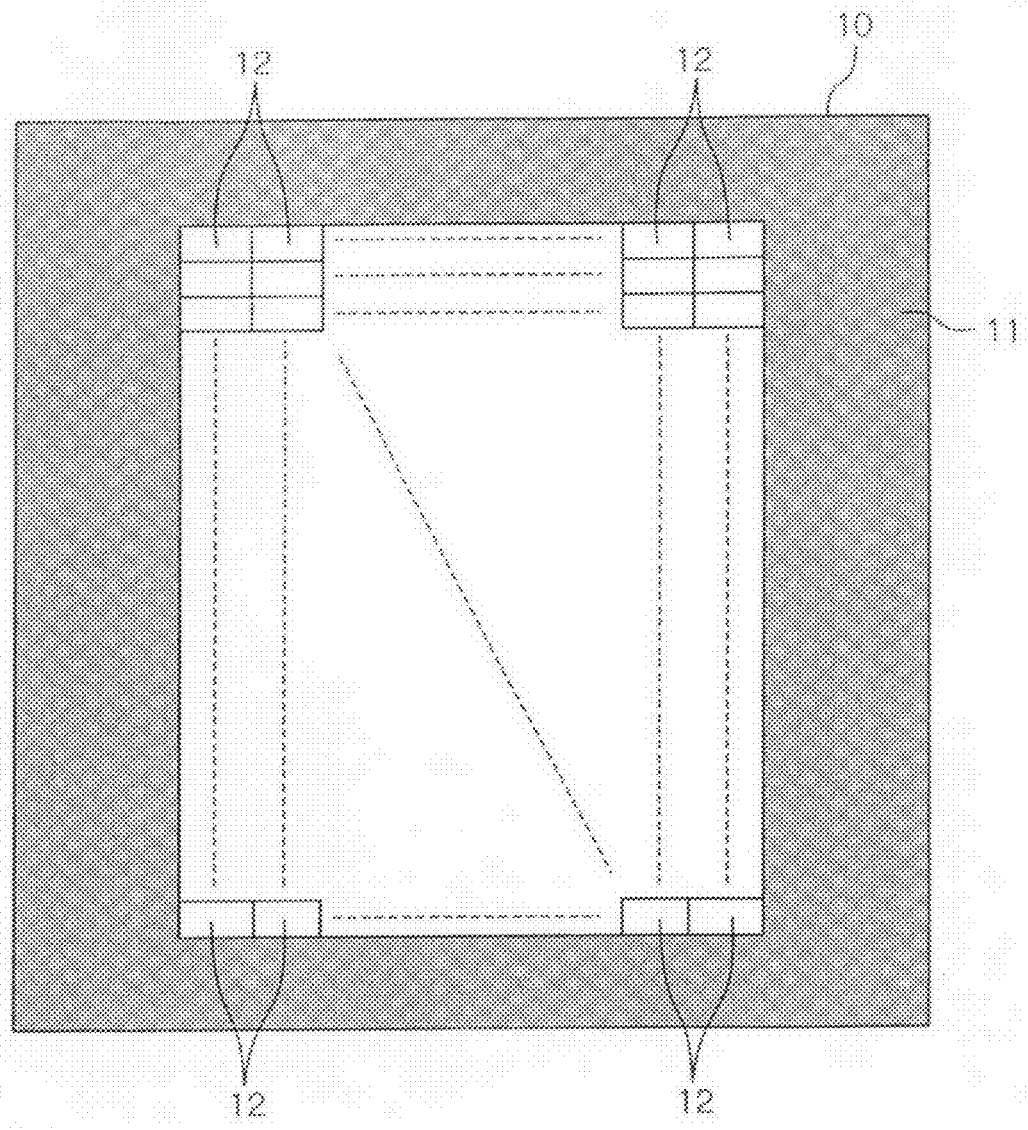
FIG. 1 shows a plane view schematically illustrating a mask layout of a photo-mask formed by a mask-forming method as a preferred embodiment according to the present invention.
Figure 2:
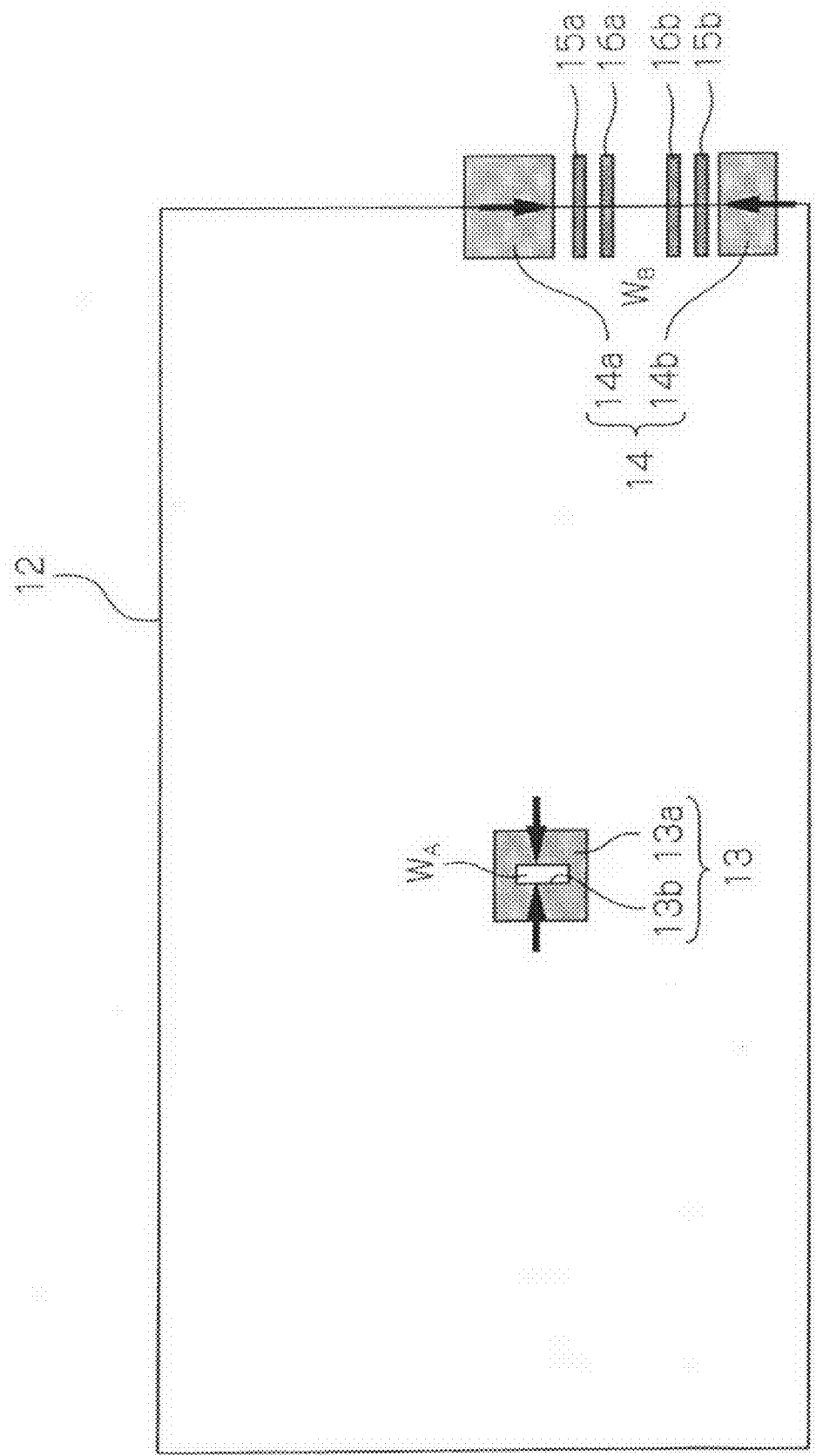
FIG. 2 shows a plane view illustrating an enlarged unit pattern section (inside of the frame) shown in FIG. 1.

FIG. 1 schematically illustrates a mask layout of a photo-mask formed by a mask-forming method as a preferred embodiment according to the present invention, and FIG. 2 illustrates an enlarged unit pattern section (inside of the frame) shown in FIG. 1.

As shown in FIG. 1, a mask pattern is formed by patterning a chromium (Cr) film 11 deposited or laminated on a fused quartz substrate 10 and thus the photo-mask is formed. The mask pattern is configured from a plurality of unit patterns 12 shown by frames respectively and continuously arranged in matrix.

In each unit pattern 12, as shown in FIG. 2, formed are a first pattern or small size pattern 13 with a narrow first width and a second pattern or large size pattern 14 with a second width extremely wider than the first width of the first pattern 13, more concretely with a wide second width that is impossible to fall within a field of view of CD-SEM. The second pattern 14 is formed to produce a symmetrical appearance with respect to the pattern center. In this embodiment, the first pattern 13 is for example a write pole pattern for a write head element of a thin-film magnetic head, and has a slit pattern 13b with a rectangular shape, formed within a chromium pattern 13a with a rectangular shape. A first width (measured width $W_A$) of the slit pattern 13b is determined to a narrow size such as for example $W_A$=0.2 μm. In this embodiment, the second pattern 14 is for example a RLG sensor pattern for the write head element of the thin-film magnetic head, and has two chromium patterns 14a and 14b opposed to each other, each having a rectangular shape. A spaced distance between side edges of these two chromium patterns 14a and 14b, that is a second width (measured width $W_B$) is determined to a wide size such as for example $W_B$=40 μm. In other words, the side edges opposed to each other of the respective chromium patterns 14a and 14b define the second width of the second pattern 14.

As shown in the figure, between the chromium patterns 14a and 14b of the second pattern 14, as will be mentioned later in detail, a pair of first dummy patterns 15a and 15b each having a rectangular or strip shape and a pair of second dummy patterns 16a and 16b each having a rectangular or strip shape are arranged.

Figure 3:
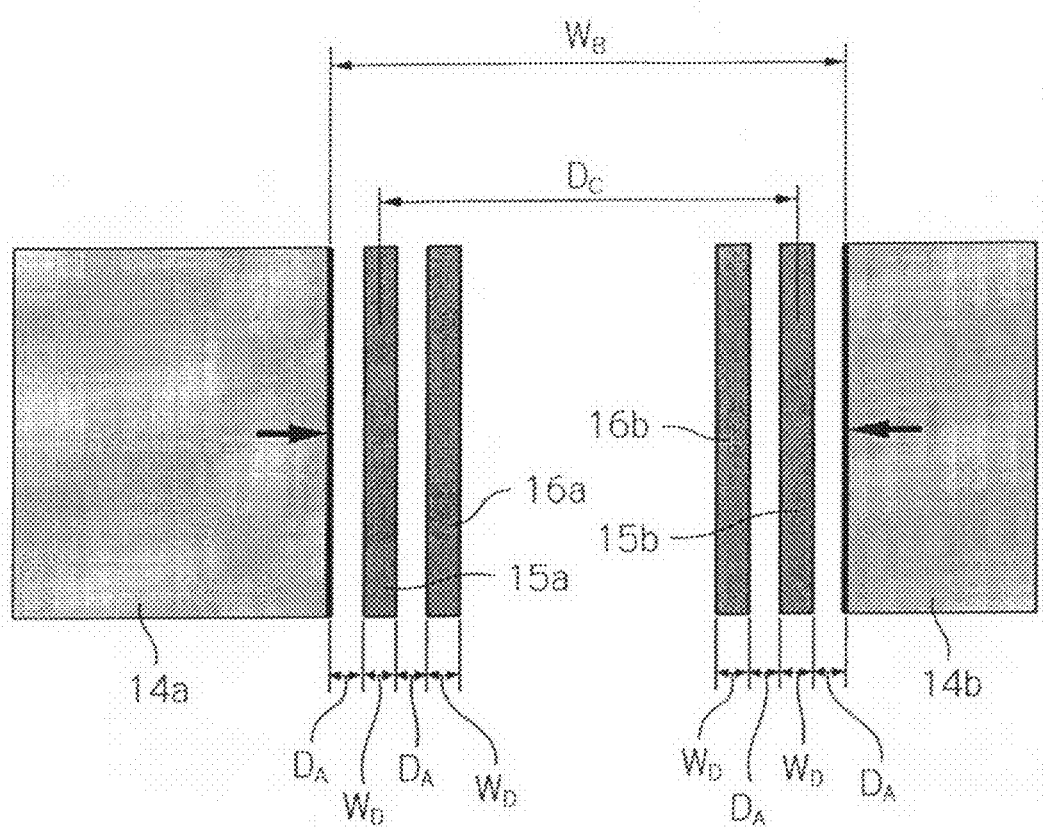
FIG. 3 shows a pattern diagram illustrating a dimension measuring method of a first pattern (small size pattern) and a second pattern (large size pattern) in the unit pattern section shown in FIG. 2.

FIG. 3 shows in detail the unit pattern section shown in FIG. 2 and illustrates the method of measuring dimensions of the first pattern (small size pattern) 13 with a narrow first width (measured width $W_A$) and the second pattern (large size pattern) 14 with a second width (measured width $W_B$) extremely wider than the first width (measured width $W_A$) of the first pattern 13.

As will be noted from the figure, in this embodiment, the first dummy pattern 15a of chromium film running in parallel to a side edge of the chromium pattern 14a of the second pattern 14 is formed at a position spaced from the side edge of the chromium pattern 14a by a spaced distance (measured distance $D_A$) nearly equal or approximate to the first width (measured width $W_A$) of the first pattern 13. A width of this first dummy pattern 15a is in this embodiment a narrow width (measured width $W_D$) nearly equal or approximate to the first width (measured width $W_A$) of the first pattern 13. Also, the second dummy pattern 16a of chromium film running in parallel to an opposite side edge of the first dummy pattern 15a is formed at a position spaced from the opposite side edge of the first dummy pattern 15a by a spaced distance (measured distance $D_A$) nearly equal or approximate to the first width (measured width $W_A$) of the first pattern 13. A width of this second dummy pattern 16a is in this embodiment a narrow width (measured width $W_D$) nearly equal or approximate to the first width (measured width $W_A$) of the first pattern 13.

The first dummy pattern 15b and the second dummy pattern 16b are similarly formed near the other chromium pattern 14b of the second pattern 14.

Figure 4:
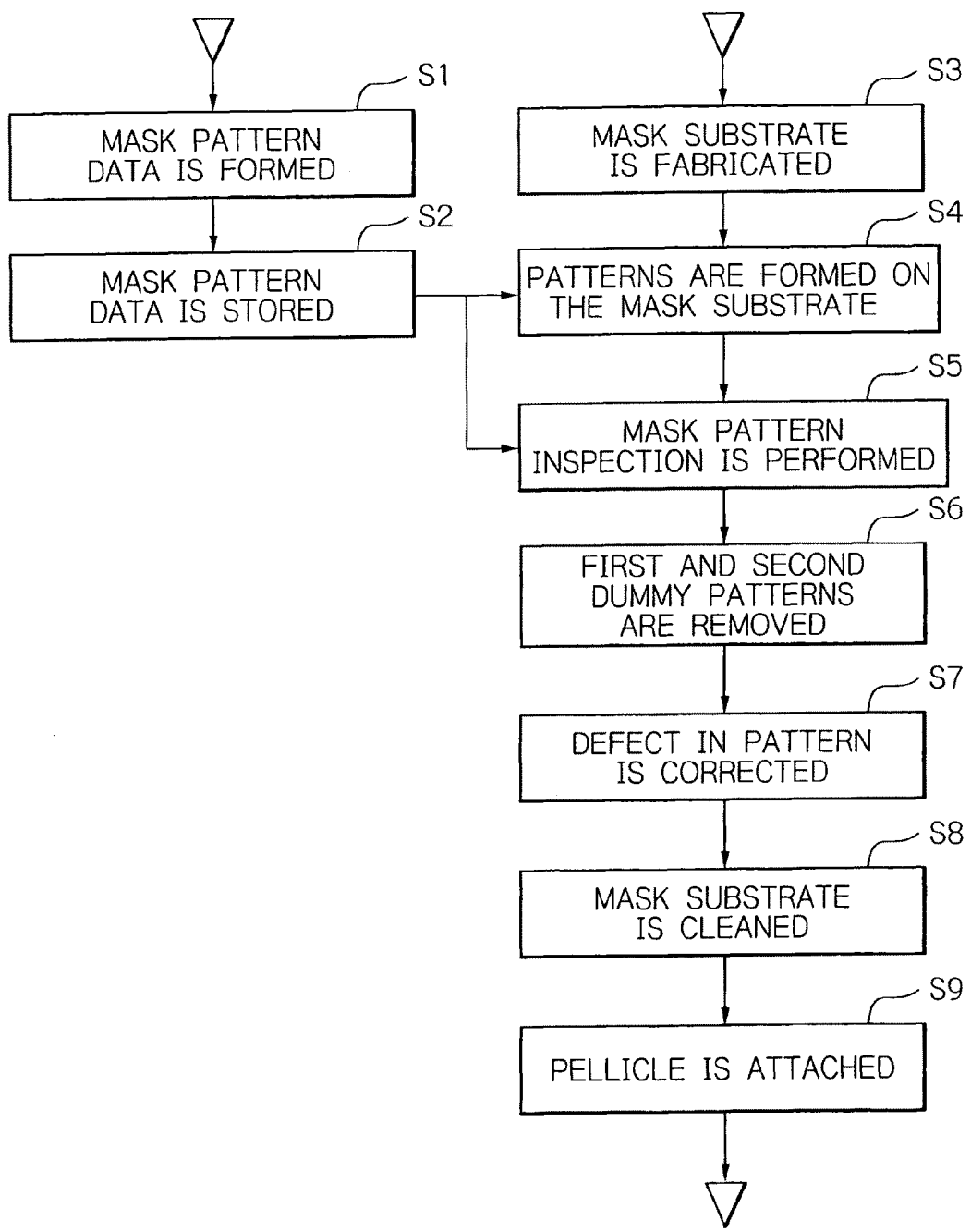
FIG. 4 shows a flow chart illustrating a part of process of the mask-forming method.
Figure 5:
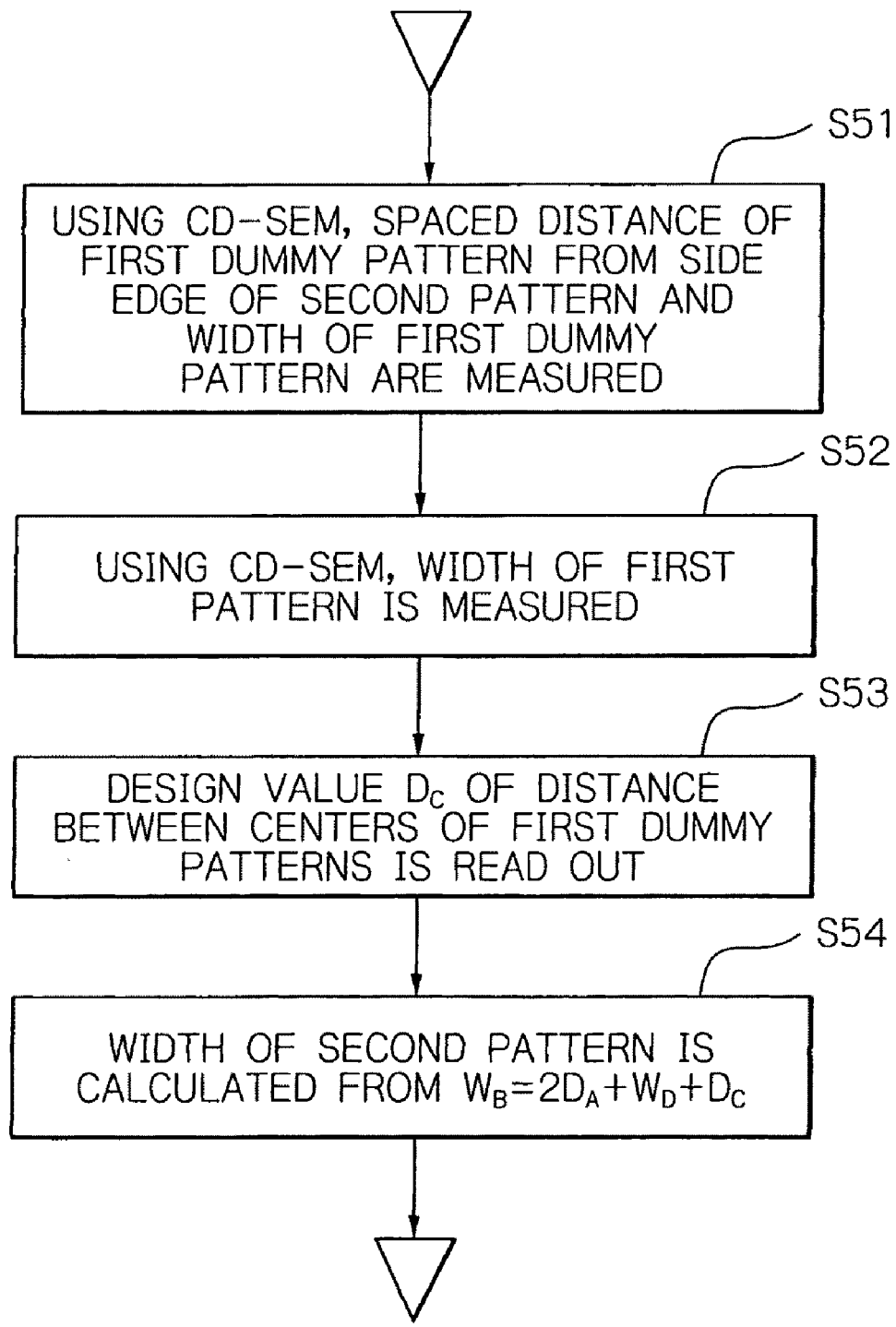
FIG. 5 shows a flow chart illustrating in detail a dimension measurement step that is a part of a pattern inspection process shown in FIG. 4.

FIG. 4 illustrates a part of process of the mask-forming method in this embodiment, and FIG. 5 illustrates in detail a dimension measurement step that is a part of a pattern inspection process shown in FIG. 4. Hereinafter, a photo-mask forming process in this embodiment will be described.

As shown in FIG. 4, at first, design rule is checked, design content is evaluated, and then design data of patterns including the first pattern 13, the second pattern 14, the first dummy patterns 15a and 15b and the second dummy patterns 16a and 16b are converted into mask pattern data for drawing function using a computer system such as CAD (Computer Aided Design) (Step S1). Then, the converted mask pattern data is stored in a memory (Step S2). These steps are in general called as MDP (Mask Data Preparation) process and well known in the art except for forming of design data of the first and second dummy patterns. Thus, detail explanation of the MDP process is omitted in the description.

On the other hand, the Cr film 11 serving as a light-shielding film is deposited or laminated on the fused quartz substrate 10 to fabricate a mask substrate (Step S3). Since this step is well known in the art, its detail explanation is omitted in the description.

Then, the mask pattern data stored in the memory is read out and a mask pattern is formed on the mask substrate using drawing and photolithography functions (Step S4). More concretely, a resist film is deposited or laminated on the Cr film 11 of the mask substrate, and then the mask pattern is transferred on the resist film by irradiating through the photo-mask an electron beam or a laser beam thereto. Then, after performing development and post-baking to make a patterned resist film or resist mask, the Cr film 11 is etched through the resist mask. Thereafter, the resist mask is removed from the substrate and the substrate is cleaned to form the chromium patterns shown in FIGS. 1 to 3. Since this process is well known in the art except for forming the first and second dummy patterns, detail explanation of this process is omitted in the description.

Then, inspection of the formed mask pattern is performed (Step S5). As for a mask pattern inspection, typically, there are an appearance inspection including a defect check and a foreign object check, and a pattern measurement including a pattern edge detection, a CD dimension measurement and a pattern-coordinate-position measurement. Hereinafter, however, only dimension measurement using CD-SEM will be described. The remaining inspection will be performed by using technique well known in the art.

As shown in FIG. 5, first, using a CD-SEM, a spaced distance of one first dummy pattern 15a from the side edge of the chromium pattern 14a of the second pattern 14 and a width of this first dummy pattern 15a are measured within the same field of view at the same magnification of the CD-SEM (Step S51). The measured spaced distance is indicated as $D_A$ and the measured width is indicated as $W_D$. In modification, using the same CD-SEM, a spaced distance of the other first dummy pattern 15b from the side edge of the chromium pattern 14b of the second pattern 14 and a width of this first dummy pattern 15b may be measured within the same field of view at the same magnification, and then an average value of the measured spaced distances and an average value of the measured widths may calculated. In order to increase the measurement accuracy, it is desired to perform the measurement by adjusting so that the distance to be measured and/or the width to be measured are located within the field of view of CD-SEM at which the CD-SEM can accurately measure the dimension, that is, at the center of the field of view of the CD-SEM.

Then, using the same CD-SEM, a width of the first pattern 13 is measured with the same magnification of the CD-SEM (Step S52). The measured width is indicated as $W_A$. In order to increase the measurement accuracy, it is desired to perform the measurement by adjusting so that the width to be measured is located within the field of view of CD-SEM at which the CD-SEM can accurately measure the dimension, that is, at the center of the field of view of the CD-SEM.

In modification, the order of Steps S51 and S52 may be inversed.

Then, a design value $D_C$ of a distance between the centers of the first dummy patterns 15a and 15b is read out from the memory (Step S53).

Then, a width or a distance between side edges of the chromium patterns 14a and 14b of the second pattern 14 is calculated from $W_B=2D_A+W_D+D_C$ (Step S54).

Therefore, the width $W_A$ of the first pattern 13 having a narrow width and the width $W_B$ of the chromium patterns 14a and 14b of the second pattern 14 having a width extremely wider than the width of the first pattern 13 can be measured at the same magnification of the same CD-SEM.

The measured widths $W_A$ of the first pattern 13 and the measured width $W_B$ of the chromium patterns 14a and 14b of the second pattern 14 are compared with the respective design values stored in the memory to check whether the pattern dimensions of the formed photo-mask is correct or not.

Thereafter, as shown in FIG. 4, the first dummy patterns 15a and 15b and the second dummy patterns 16a and 16b, which are now unnecessary are removed by wet etching or dry etching for example (Step S6).

Then, defect in the mask pattern, revealed by the inspection is corrected (Step S7). As for the defect correction, there are white defect correction for modifying lacked portion of the Cr film or light shielding film and black defect correction for modifying redundant portion of the Cr film. A laser beam or FIB (Focused Ion Beam) may be used for the correction. Since this defect correction process is well known in the art, detail explanation of this process is omitted in the description.

Then, final cleaning of the mask substrate is performed (Step S8). Since this cleaning process is also well known in the art, detail explanation of this process is omitted in the description.

Thereafter, a pellicle that is a dust control protection film is attached to the photo-mask (Step S9). Since this pellicle mounting process is also well known in the art, detail explanation of this process is omitted in the description.

As aforementioned in detail, according to this embodiment, the first dummy patterns 15a and 15b spaced respectively from the side edges of the chromium patterns 14a and 14b of the second pattern (large size pattern) 14 by a distance approximate to the width $W_A$ of the first pattern (small size pattern) 13 and each provided with a narrow width are formed, and the spaced distance and the width of the first dummy patterns 15a and/or 15b are measured by CD-SEM within the same field of view at the same magnification of the CD-SEM. Then, a width (distance between side edges) $W_B$ of the chromium patterns 14a and 14b of the second pattern 14 is calculated from $W_B=2D_A+W_D+D_C$, where $D_C$ is a design value of the distance between the centers of a pair of the first dummy patterns 15a and 15b, $D_A$ is a measured spaced distance of the first dummy patterns 15a and/or 15b from the side edge of the chromium patterns 14a and/or 14b of the second pattern 14, and $W_D$ is a measured width of the first dummy patterns 15a and/or 15b. A width $W_A$ of the first pattern 13 can be measure by the same CD-SEM within the same measuring conditions (the same magnification) because the width $W_A$ is the similar size as that of the distance $D_A$ and the width $W_D$. Since the distance $D_A$ and the width $W_D$ are measured within the same field of view of the CD-SEM and also the width $W_A$ of the first pattern 13 is measured in the same measuring conditions as the distance $D_A$ and the width $W_D$, these widths and distance can be easily and accurately measured with the same degree of accuracy. Further, the second pattern 14 is formed in a cyclic pattern to produce a symmetrical appearance with respect to the pattern center. Therefore, the pair of first dummy patterns 15a and 15b formed inside of the chromium patterns 14a and 14b of the second pattern 14 will produce a symmetrical appearance with respect to the pattern center. Thus, the distance between the centers of a pair of the first dummy patterns 15a and 15b is always kept at constant value that is equal to the design value $D_C$, although the centers of the first dummy patterns 15a and 15b themselves may be moved. As a result, the width $W_B$ of the second pattern 14 calculated from $W_B=2D_A+W_D+D_C$ can be obtained with the same accuracy as that of the width $W_A$ of the first pattern 13, and these width $W_B$ and $W_A$ can be easily and accurately obtained.

Also, according to this embodiment, since the second dummy patterns 16a and 16b are formed at the opposite sides of the first dummy patterns 15a and 15b with respect to the second patterns 14a and 14b, respectively, boundary conditions at both side edges of each of the first dummy patterns 15a and 15b can be maintained equal to each other and therefore development conditions such as distribution of developer at the both side edges can be equalized to each other. As a result, both side edges of each of the first dummy patterns 15a and 15b can be determined so that the center position of each of the first dummy pattern does not displace due to the development for example.

In this embodiment, the first dummy patterns 15a and 15b are formed at positions spaced from the side edges of the chromium patterns 14a and 14b of the second pattern 14 by a distance nearly equal or approximate to the first width of the first pattern 13, respectively. However, it is desired that this spaced distance is equal to the first width of the first pattern 13. Also, in this embodiment, the width of the first dummy patterns 15a and 15b is set to a value nearly equal or approximate to the first width of the first pattern 13. However, it is desired that this width of the first dummy patterns is equal to the first width of the first pattern 13. If the spaced distance and the width of the first dummy patterns are set to equal to the first width of the first pattern 13, measurement accuracies of the widths of the first and second patterns can be more precisely coincided.

Figure 6:
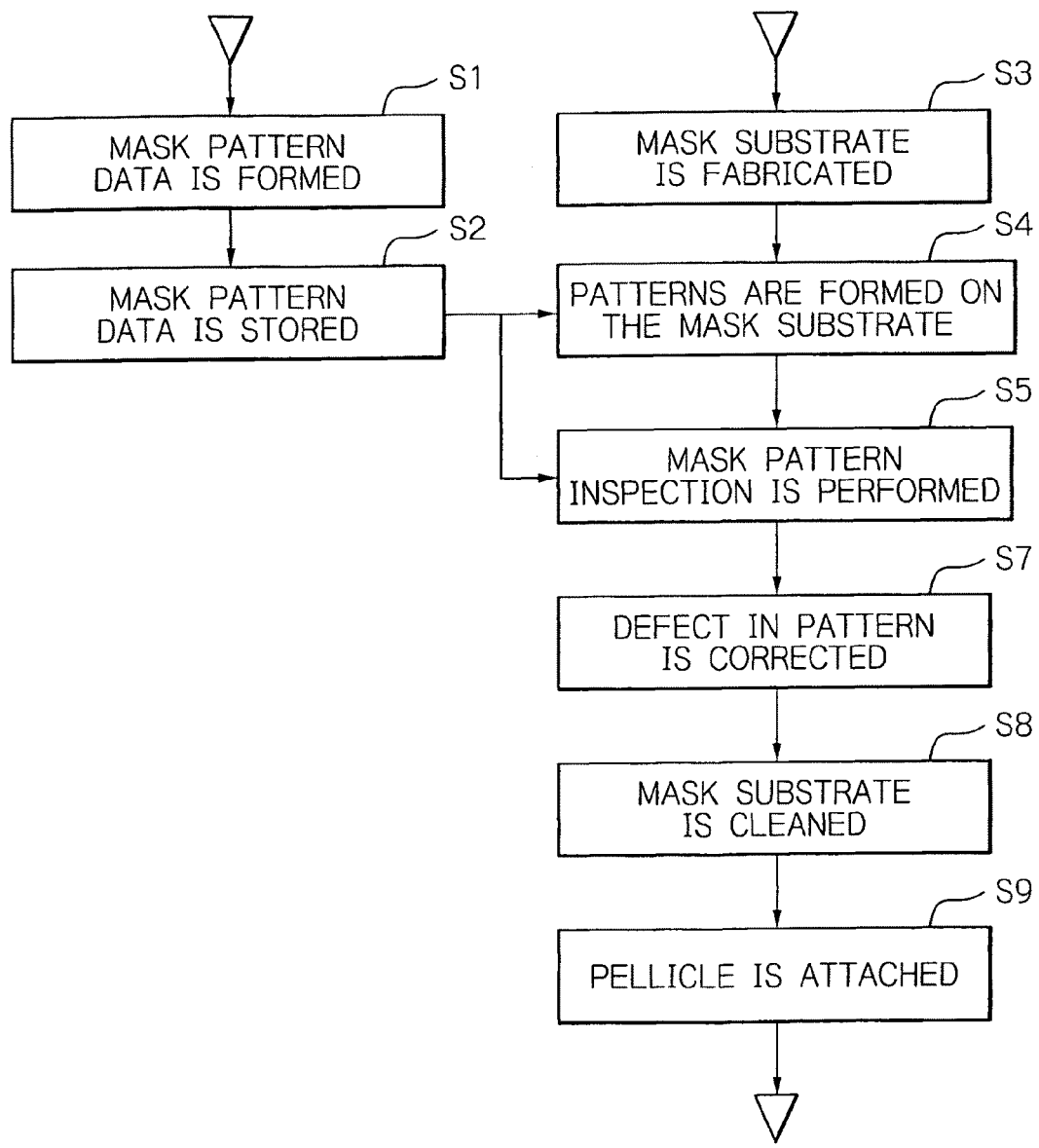
FIG. 6 shows a flow chart illustrating a part of process of a mask-forming method as another embodiment according to the present invention.

FIG. 6 illustrates a part of process of the mask-forming method in another embodiment according to the present invention. In this embodiment, mask patterns of the photo-mask are the same as the former embodiment shown in FIGS. 1 to 3. Thus, in this embodiment, the same reference numerals are used for the same elements as in the former embodiment. Hereinafter, a photo-mask forming process in this embodiment will be described.

As shown in FIG. 6, at first, design rule is checked, design content is evaluated, and then design data of patterns including the first pattern 13, the second pattern 14, the first dummy patterns 15a and 15b and the second dummy patterns 16a and 16b are converted into mask pattern data for drawing function using a computer system such as CAD (Step S1). Then, the converted mask pattern data is stored in a memory (Step S2). These steps are in general called as MDP process and well known in the art except for forming of design data of the first and second dummy patterns. Thus, detail explanation of the MDP process is omitted in the description.

On the other hand, the Cr film 11 serving as a light-shielding film is deposited or laminated on the fused quartz substrate 10 to fabricate a mask substrate (Step S3). Since this step is well known in the art, its detail explanation is omitted in the description.

Then, the mask pattern data stored in the memory is read out and a mask pattern is formed on the mask substrate using drawing and photolithography functions (Step S4). More concretely, a resist film is deposited or laminated on the Cr film 11 of the mask substrate, and then the mask pattern is transferred on the resist film by irradiating through the photo-mask an electron beam or a laser beam thereto. Then, after performing development and post-baking to make a patterned resist film or resist mask, the Cr film 11 is etched through the resist mask. Thereafter, the resist mask is removed from the substrate and the substrate is cleaned to form the chromium patterns shown in FIGS. 1 to 3. Since this process is well known in the art except for forming the first and second dummy patterns, detail explanation of this process is omitted in the description.

Then, inspection of the formed mask pattern is performed (Step S5). This inspection process is the same as that shown in FIG. 5.

Then, defect in the mask pattern, revealed by the inspection is corrected (Step S7). As for the defect correction, there are white defect correction for modifying lacked portion of the Cr film or light shielding film and black defect correction for modifying redundant portion of the Cr film. A laser beam or FIB may be used for the correction. Since this defect correction process is well known in the art, detail explanation of this process is omitted in the description.

Then, final cleaning of the mask substrate is performed without removing the first dummy patterns 15a and 15b and the second dummy patterns 16a and 16b, which are now unnecessary (Step S8). Since this cleaning process is also well known in the art, detail explanation of this process is omitted in the description.

Thereafter, a pellicle that is a dust control protection film is attached to the photo-mask (Step S9). Since this pellicle mounting process is also well known in the art, detail explanation of this process is omitted in the description.

Configuration of this embodiment is the same as that of the former embodiment of FIGS. 1 to 5 except that the first dummy patterns 15a and 15b and the second dummy patterns 16a and 16b are remained in the photo-mask pattern. Therefore, advantages of this embodiment are the same as these in the former embodiment of FIGS. 1 to 5 except that this embodiment can simplify the fabrication process because no removing process of the dummy patterns is necessary.

FIG. 7 illustrates layout of a first pattern (small size pattern) and a second pattern (large size pattern) in a further embodiment according to the present invention.

As will be apparent by comparison of this figure with FIG. 3, in this embodiment, only first dummy patterns 15a and 15b are formed but no second dummy pattern is formed. Under some development conditions such as distribution of developer, even if there is no second dummy pattern, boundary conditions at both side edges of each of the first dummy patterns 15a and 15b may be maintained equal to each other. As a result, both side edges of each of the first dummy patterns 15a and 15b can be determined so that the center position of each of the first dummy pattern does not displace or deviate.

Since the dimension measuring method of pattern and the pattern forming method according to this embodiment is the same as that of the already mentioned embodiments of FIGS. 1 to 6 except for using of patterns indicated in FIG. 7, detail explanation of this embodiment is omitted in the description.

FIG. 8 illustrates layout of a first pattern (small size pattern) and a second pattern (large size pattern) in a still further embodiment according to the present invention.

As will be apparent by comparison of this figure with FIG. 3, in this embodiment, not only the first dummy patterns 15a and 15b and the second dummy patterns 16a and 16b but also third dummy patterns 17a and 17b and another dummy patterns not shown are formed. Spaced distances and widths of the third dummy patterns 17a and 17b and another dummy patterns are the same as these of the second dummy patterns 16a and 16b.

Since the dimension measuring method of pattern and the pattern forming method according to this embodiment is the same as that of the already mentioned embodiments of FIGS. 1 to 7 except for using of patterns indicated in FIG. 8, detail explanation of this embodiment is omitted in the description.

FIGS. 9a to 9d illustrate layouts of a first pattern (small size pattern) and a second pattern (large size pattern) in further various embodiments according to the present invention.

In the embodiment shown in FIGS. 1 to 5, the embodiment shown in FIG. 6, the embodiment shown in FIG. 7 and the embodiment shown in FIG. 8, the first pattern (small size pattern) is a slit pattern with a rectangular shape and chromium patterns of the second pattern (large size pattern), the first dummy patterns and the second dummy patterns are rectangular shaped patterns with the same length in a longitudinal direction, respectively. Contrary to this, in the embodiment shown in FIG. 9a, a first pattern (small size pattern) is constituted from strip shaped patterns 93a and 93b with rectangular shapes opposed to each other, a second pattern (large size pattern) is constituted from strip shaped patterns 94a and 94b with rectangular shapes opposed to each other, first dummy patterns 95a and 95b and second dummy patterns 96a and 96b are constituted from strip shaped patterns with rectangular shapes and with a longitudinal direction length different from that of the patterns 94a and 94b of the second pattern.

Figure 9A:
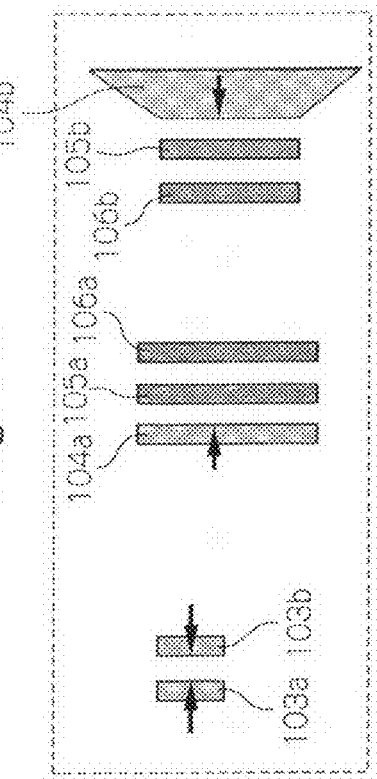
FIGS. 9a to 9d show pattern diagrams illustrating layouts of a first pattern (small size pattern) and a second pattern (large size pattern) in further various embodiments according to the present invention.

Since the dimension measuring method of pattern and the pattern forming method according to this embodiment is the same as that of the already mentioned embodiments of FIGS. 1 to 8 except for using of patterns indicated in FIG. 9a, detail explanation of this embodiment is omitted in the description.

Figure 9B:
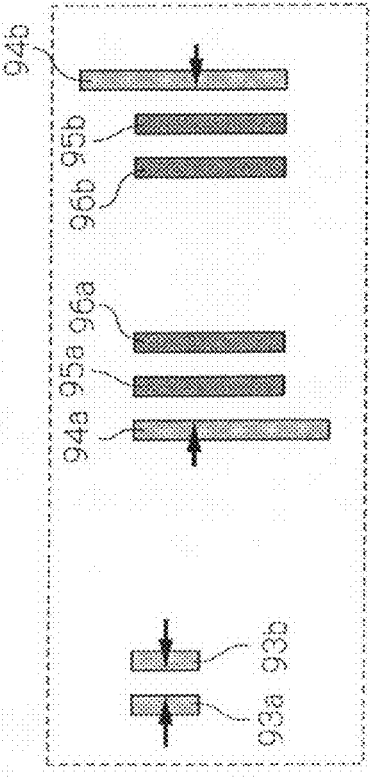

In the embodiment shown in FIG. 9b, a first pattern (small size pattern) is constituted from strip shaped patterns 103a and 103b with rectangular shapes opposed to each other, a second pattern (large size pattern) is constituted from a strip shaped pattern 104a with a rectangular shape and a trapezoid shaped pattern 104b opposed to each other, first dummy patterns 105a and 105b are constituted from strip shaped patterns with rectangular shapes and with longitudinal direction lengths different from each other, and second dummy patterns 106a and 106b are constituted from strip shaped patterns with rectangular shapes and with longitudinal direction lengths different from each other.

Since the dimension measuring method of pattern and the pattern forming method according to this embodiment is the same as that of the already mentioned embodiments of FIGS. 1 to 9a except for using of patterns indicated in FIG. 9b, detail explanation of this embodiment is omitted in the description.

Figure 9C:
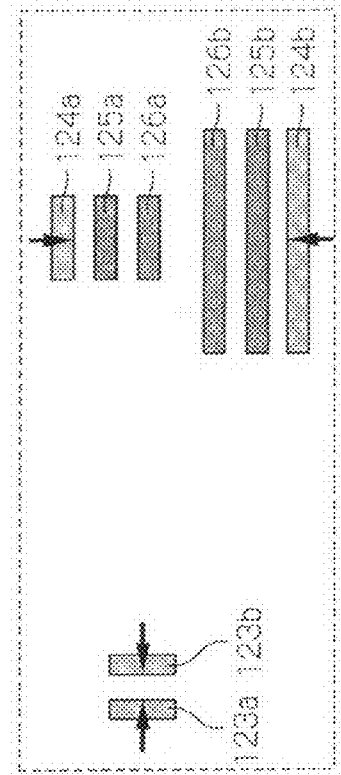

In the embodiment shown in FIG. 9c, a first pattern (small size pattern) is constituted from strip shaped patterns 113a and 113b with rectangular shapes opposed to each other, a second pattern (large size pattern) is constituted from strip shaped patterns 114a and 114b with rectangular shapes opposed to each other and with longitudinal direction lengths different from each other, first dummy patterns 115a and 115b are constituted from strip shaped patterns with rectangular shapes opposed to each other and with longitudinal direction lengths different from each other, and second dummy patterns 116a and 116b are constituted from strip shaped patterns with rectangular shapes opposed to each other and with longitudinal direction lengths different from each other.

Since the dimension measuring method of pattern and the pattern forming method according to this embodiment is the same as that of the already mentioned embodiments of FIGS. 1 to 9b except for using of patterns indicated in FIG. 9c, detail explanation of this embodiment is omitted in the description.

Figure 9D:
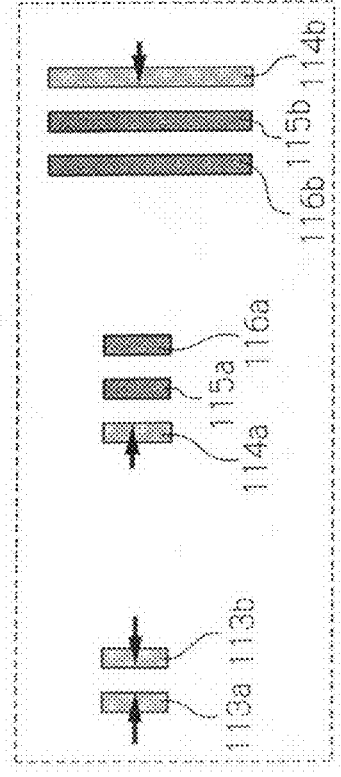

In the embodiment shown in FIG. 9d, a first pattern (small size pattern) is constituted from strip shaped patterns 123a and 123b with rectangular shapes opposed to each other, a second pattern (large size pattern) is constituted from strip shaped patterns 124a and 124b with rectangular shapes opposed to each other and with longitudinal direction lengths different from each other, first dummy patterns 125a and 125b are constituted from strip shaped patterns with rectangular shapes opposed to each other and with longitudinal direction lengths different from each other, and second dummy patterns 126a and 126b are constituted from strip shaped patterns with rectangular shapes opposed to each other and with longitudinal direction lengths different from each other. Furthermore, longitudinal directions of the strip shaped patterns 124a and 124b of the second pattern, the first dummy patterns 125a and 125b and the second dummy patterns 126a and 126b are directed perpendicular to these of the strip shaped patterns 123a and 123b of the first pattern.

Since the dimension measuring method of pattern and the pattern forming method according to this embodiment is the same as that of the already mentioned embodiments of FIGS. 1 to 9c except for using of patterns indicated in FIG. 9d, detail explanation of this embodiment is omitted in the description.

In the aforementioned embodiments, the first pattern with a narrow width (small size pattern) is a write pole pattern for a write head element of a thin-film magnetic head, and the second pattern (large size pattern) is a RLG sensor pattern for the write head element of the thin-film magnetic head. However, application of the method according to the present invention is not limited to them, in other words, the first pattern (small size pattern) and the second pattern (large size pattern) may be any small size and large size patterns formed within the same photo-mask pattern. For example, the present invention can be applied to a photo-mask with a data channel head pattern for a multi-channel magnetic tape head as the first pattern (small size pattern) and with a tracking channel head pattern for the multi-channel magnetic tape head as the second pattern (large size pattern).

Although the aforementioned measurement method of a mask pattern concerns a mask pattern formed on a photomask, it is apparent that the measurement method according to the present invention can be similarly applied to a resist pattern formed on a wafer.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method of measuring dimension of a first pattern with a narrow first width, and a second pattern with a second width wider than the first width of said first pattern and formed in a symmetrical appearance with respect to a center of the second pattern, said second pattern having edges opposed to each other defining the second width, said method comprising:
   a step of forming a pair of first dummy patterns each having a narrow width, said pair of first dummy patterns being spaced from said edges of said second pattern respectively by a distance approximate to the first width of said first pattern;
   a first measurement step of measuring, using a dimension measuring device, a spaced distance of one of said first dummy patterns from the edge of said second pattern and a width of said one of said first dummy patterns within the same field of view of said dimension measuring device;

a second measurement step of measuring, using said dimension measuring device, a width of said first pattern under the same measurement condition as that of the first measurement step; and a calculation step of calculating a width of said second pattern from $W_B=2D_A+W_D+D_C$, where $W_B$ is the calculated width of said second pattern, $D_C$ is a design value of a distance between the centers of said pair of first dummy patterns, $D_A$ is a measured spaced distance of said one of said first dummy patterns from the edge of said second pattern, and $W_D$ is a measured width of said one of said first dummy patterns.

2. The method as claimed in claim 1, wherein said method further comprises a step of forming a pair of second dummy patterns each having a narrow width, said pair of second dummy patterns being spaced from edges opposed to each other of the respective first dummy patterns by said spaced distance, respectively.

3. The method as claimed in claim 2, wherein said method further comprises a step of removing said pair of first dummy patterns and said pair of second dummy patterns after said first and second measurement steps.

4. The method as claimed in claim 1, wherein said dimension measuring device is a scanning electron microscope.

5. The method as claimed in claim 4, wherein said first measurement step comprises measuring a spaced distance of one of said first dummy patterns from the edge of said second pattern and a width of said one of said first dummy patterns within the same field of view of said scanning electron microscope, said field of view being determined so that said scanning electron microscope can accurately measure.

6. The method as claimed in claim 1, wherein said distance between each of said pair of first dummy patterns and the respective edges of said second pattern is equal to the first width of said first pattern.

7. The method as claimed in claim 1, wherein said method further comprises a step of removing said pair of first dummy patterns after said first and second measurement steps.

8. The method as claimed in claim 1, wherein said first patterns and said second pattern are mask pattern formed on a photo-mask.

9. The method as claimed in claim 1, wherein said first patterns and said second pattern are resist pattern formed on a wafer.

10. A method of forming a pattern including a process of measuring dimension of a first pattern with a narrow first width, and a second pattern with a second width wider than the first width of said first pattern and formed in a symmetrical appearance with respect to a center of the second pattern, said second pattern having edges opposed to each other defining the second width, and a process of correcting defect of the pattern depending upon the measured dimension, said process of measuring dimension comprising:

a step of forming a pair of first dummy patterns each having a narrow width, said pair of first dummy patterns being spaced from said edges of said second pattern respectively by a distance approximate to the first width of said first pattern;

a first measurement step of measuring, using a dimension measuring device, a spaced distance of one of said first dummy patterns from the edge of said second pattern and a width of said one of said first dummy patterns within the same field of view of said dimension measuring device;

a second measurement step of measuring, using said dimension measuring device, a width of said first pattern under the same measurement condition as that of the first measurement step; and a calculation step of calculating a width of said second pattern from $W_B=2D_A+W_D+D_C$, where $W_B$ is the calculated width of said second pattern, $D_C$ is a design value of a distance between the centers of said pair of first dummy patterns, $D_A$ is a measured spaced distance of said one of said first dummy patterns from the edge of said second pattern, and $W_D$ is a measured width of said one of said first dummy patterns.

11. The method as claimed in claim 10, wherein said process of measuring dimension further comprises a step of forming a pair of second dummy patterns each having a narrow width, said pair of second dummy patterns being spaced from edges opposed to each other of the respective first dummy patterns by said spaced distance, respectively.

12. The method as claimed in claim 11, wherein said process of measuring dimension further comprises a step of removing said pair of first dummy patterns and said pair of second dummy patterns after said first and second measurement steps.

13. The method as claimed in claim 10, wherein said dimension measuring device is a scanning electron microscope.

14. The method as claimed in claim 13, wherein said first measurement step comprises measuring a spaced distance of one of said first dummy patterns from the edge of said second pattern and a width of said one of said first dummy patterns within the same field of view of said scanning electron microscope, said field of view being determined so that said scanning electron microscope can accurately measure.

15. The method as claimed in claim 10, wherein said distance between each of said pair of first dummy patterns and the respective edges of said second pattern is equal to the first width of said first pattern.

16. The method as claimed in claim 10, wherein said process of measuring dimension further comprises a step of removing said pair of first dummy patterns after said first and second measurement steps.

17. The method as claimed in claim 10, wherein said first patterns and said second pattern are mask pattern formed on a photo-mask.

18. The method as claimed in claim 10, wherein said first patterns and said second pattern are resist pattern formed on a wafer.

* * * * *